(12) United States Patent
Hamaji

(10) Patent No.: US 7,473,624 B2
(45) Date of Patent: Jan. 6, 2009

(54) METHOD FOR MANUFACTURING SEMICONDUCTOR DEVICE

(75) Inventor: Masakatsu Hamaji, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 416 days.

(21) Appl. No.: 11/078,401

(22) Filed: Mar. 14, 2005

(65) Prior Publication Data

US 2005/0208743 A1    Sep. 22, 2005

(30) Foreign Application Priority Data

Mar. 16, 2004    (JP) ............... 2004-073864

(51) Int. Cl.
*H01L 21/3205* (2006.01)
*H01L 21/4763* (2006.01)

(52) U.S. Cl. .............. 438/587; 438/617; 438/689

(58) Field of Classification Search .......... 257/620, 257/203, 204, 532; 438/598, 129, 587, 617, 438/689
See application file for complete search history.

(56) References Cited

U.S. PATENT DOCUMENTS

| | | | | |
|---|---|---|---|---|
| 4,682,202 A | * | 7/1987 | Tanizawa | ............... 257/204 |
| 4,945,395 A | * | 7/1990 | Suehiro | ............... 257/203 |
| 5,171,701 A | * | 12/1992 | Nagamatsu | ............... 438/598 |
| 5,561,317 A | * | 10/1996 | Momma et al. | ............... 257/620 |
| 5,872,027 A | * | 2/1999 | Mizuno | ............... 438/129 |
| 6,732,335 B2 | * | 5/2004 | Takabayashi et al. | ............... 716/1 |

FOREIGN PATENT DOCUMENTS

| | | |
|---|---|---|
| JP | 05-013680 | 1/1993 |
| JP | 06-077442 | 3/1994 |
| JP | 11-274441 | 10/1999 |

* cited by examiner

*Primary Examiner*—Walter L Lindsay, Jr.
*Assistant Examiner*—Kenisha V Ford
(74) *Attorney, Agent, or Firm*—Young & Thompson

(57) ABSTRACT

There is provided a method for manufacturing the semiconductor device for obtaining capacitance characteristics of a larger capacitance and delay characteristics with higher efficiency. An embodiment according to the present invention employs the configuration of forming the gate polysilicon layer by conducting the customization by using the customized reticle. For example, gate polysilicon layer having a larger dimension such as gate length and the like is formed by using the dedicated gate reticle, only for an user who requests the countermeasure for the EMI noise. Having such process, a larger-scale capacitance can be provided without increasing the process cost.

3 Claims, 17 Drawing Sheets

PRIOR ART

PRIOR ART

PRIOR ART

PRIOR ART

72

PRIOR ART

PRIOR ART

PRIOR ART

METHOD FOR MANUFACTURING SEMICONDUCTOR DEVICE

The present application is based on Japanese Patent Application NO. 2004-073864, the content of which is incorporated hereinto by reference.

BACKGROUND OF THE INVENTION

1. Field of the Invention

The present invention relates to a method for manufacturing a semiconductor device.

2. Related Art

In recent years, the increased performances and increased level of integration of the LSI are achieved, and a problem of an electromagnetic interference (EMI) has become to be intensified.

Although the countermeasure for the EMI have been presented by utilizing a packaging of a semiconductor device in the conventional technology, such type of countermeasure may also be a factor of an increase of cost and may cause a decrease of cost-competitiveness thereof. Therefore, countermeasures for the EMI in the interior of LSI have become to be often conducted as a method for reducing the increase of cost as much as possible.

Methods for providing countermeasures for the EMI of the interior of LSI generally classified into two types of methods: spectrum spread of an operating clock; and intensification of a power supply line.

Among these, a countermeasure by utilizing a capacity cell (a capacitor) has been often employed as a typical countermeasure for the EMI via the intensification of the power supply line.

However, when the capacity cell is utilized for the countermeasures for the EMI, embedded array and/or cell base IC, which are diffused from the underlying layer should have been employed in the conventional technology.

On the other hand, the miniaturization in the manufacturing process leads to manifesting a problem of an increase of the cost for manufacturing reticles. In such situation, master slice LSI have recently become to be employed, which can inhibits an increase of cost for manufacturing reticles by having a configuration of conducting a customization process for only the metal upper layers.

Among such types of technologies, a method for manufacturing a capacity cell is disclosed in Japanese Patent Laid-Open No. 1993-13,680 (H05-13, 680), in which a gate of an unused basic cell is coupled to a power supply electric potential (VDD) or a grounding electric potential (GND) to compose a capacitance of a gate polysilicon layer and an underlying gate oxide film and an inversion layer. Alternatively, a $P^+/N^+$ diffusion layer of the unused cell is coupled to the power supply electric potential (VDD) or to the grounding electric potential (GND) to compose a PN junction capacitance of the $P^+/N^+$ diffusion layer and a P/N well.

In addition, a method for manufacturing a capacitance is disclosed in Japanese Patent Laid-Open No. 1994-77,442 (H06-77,442), in which a polysilicon layer, a gate oxide film and an insulating film in an unused basic cell are removed at the time of completing the process for forming the polysilicon layer, and thereafter new gate oxide film and new polysilicon layer are formed again on that portion. Further, the formed polysilicon layer is divided into a PMOS side and a NMOS side, and the polysilicon of the PMOS side is coupled to the grounding electric potential (GND) and the polysilicon of the NMOS side is coupled to the power supply electric potential (VDD), respectively, to create inversion layers for the NMOS and the PMOS, respectively, thereby composing capacitances between the inversion layer and the polysilicon layer.

Further, a method for manufacturing a capacitance is disclosed in Japanese Patent Laid-Open No. 1999-274,441 (H11-274, 441), in which a sub-contact region for an interconnect adjacent to basic cell is employed to form a gate oxide film and a polysilicon layer, similarly as in the technology disclosed in Japanese Patent Laid-Open No. 1994-77, 442. Further, the polysilicon of the PMOS side is coupled to the grounding electric potential (GND) and the polysilicon of the NMOS side is coupled to the power supply electric potential (VDD), respectively, to compose capacities between the inversion layers and the polysilicon layers. However, since sufficient capacitance for providing the EMI noise countermeasure can not be obtained in the capacitance of the sub-contact region, the process for DRAM is further utilized in the sub-contact region to form a trench structure, thereby achieving large capacitance.

SUMMARY OF THE INVENTION

However, it has now been discovered that the conventional process for forming the capacity utilizing the basic cell can not often ensure sufficient capacitance for the countermeasure of the EMI or for the adjusting the delay.

Moreover, additional process steps for removing the polysilicon layer, the gate oxide film and the insulating film and for forming a new gate oxide film and a new polysilicon layer are further required for achieving the large-scale capacitance in addition to the ordinary manufacturing process, or an additional process equivalent to the process for forming DRAM is further required. Therefore, an increase of the process cost may be caused and, in turn, an increase of the cost for manufacturing chips may be caused.

Here, Japanese Patent Laid-Open No. 1994-77,442 discloses the removal of the polysilicon layer, the gate oxide film and the insulating film and the division of the polysilicon layer for re-formation into the NMOS and PMOS sides, in relation to only in the region of the unused basic cell. On the other hand, no specific description related to a method for forming a region of the used basic cell is included in these disclosures.

In the conventional technologies stated above, the customized reticles are employed only in the case of forming the upper layer metal, and no customized reticle is employed when the gate polysilicon layer is formed. Inventors of the present inventions have actively conducting the researches and developments, and found that the problem described above can be addressed by employing the customized reticle when the gate polysilicon layer is formed.

According to the present invention, there is provided a method for manufacturing a semiconductor device, comprising manufacturing the semiconductor device including a predetermined gate pattern and a capacitor by a master slice technique, comprising; forming a conductive film over a semiconductor insulator; and forming the predetermined gate pattern and the capacitor by patterning the conductive film employing a customized reticle.

According to the present invention, a conductive film that is formed over a silicon insulator is patterned by employing the customized reticle to form a customized gate pattern and a customized capacitor. Therefore, the semiconductor device having improved capacitance characteristics and/or improved delay characteristics can be manufactured with higher efficiency.

According to the present invention, there is provided a method for manufacturing a semiconductor device, comprising: manufacturing the semiconductor device including a capacitor by a master slice technique, wherein a customized reticle, which is customized according to a requirement, is employed as a reticle for forming a gate polysilicon layer, which is employed in the formation of the capacitor.

According to the present invention, a customized reticle, which is customized according to a requirement of a user, is employed as a reticle for forming a gate polysilicon layer to form a customized gate polysilicon layer. Therefore, the semiconductor device having improved capacitance characteristics and/or improved delay characteristic can be manufactured with higher efficiency.

According to the present invention, there is provided a method for manufacturing a semiconductor device, comprising manufacturing the semiconductor device by conducting a wiring based on a circuit data to a basic cell including a transistor formed by employing a reticle having a predetermined pattern, comprising; forming a conductive film over a semiconductor insulator; and patterning said conductive film by employing a reticle having a predetermined first gate pattern for forming a gate electrode of said basic cell and a second gate pattern for forming a capacitor element in said basic cell.

According to the present invention, a conductive film that is formed over a silicon insulator is patterned by employing the customized reticle to form a customized gate pattern. Therefore, the semiconductor device having improved capacitance characteristics and/or improved delay characteristics can be manufactured with higher efficiency.

According to the present invention, since the customized reticle is also employed even in the formation of the gate polysilicon layer in the method for manufacturing the semiconductor device having the capacitor by the master slice technique, the capacitance characteristics of the larger capacitance and the delay characteristics, which could have only been achieved if the embedded arrays or the cell base IC is employed in the conventional technologies, can be obtained with higher efficiency. In addition, the unused basic cell and the I/O slot can be effectively utilized.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments according to the present invention will be described as follows in reference to the annexed figures. In all figures, identical numeral is assigned to an element commonly appeared in figures, and the detailed description thereof is not presented.

Figure 1:
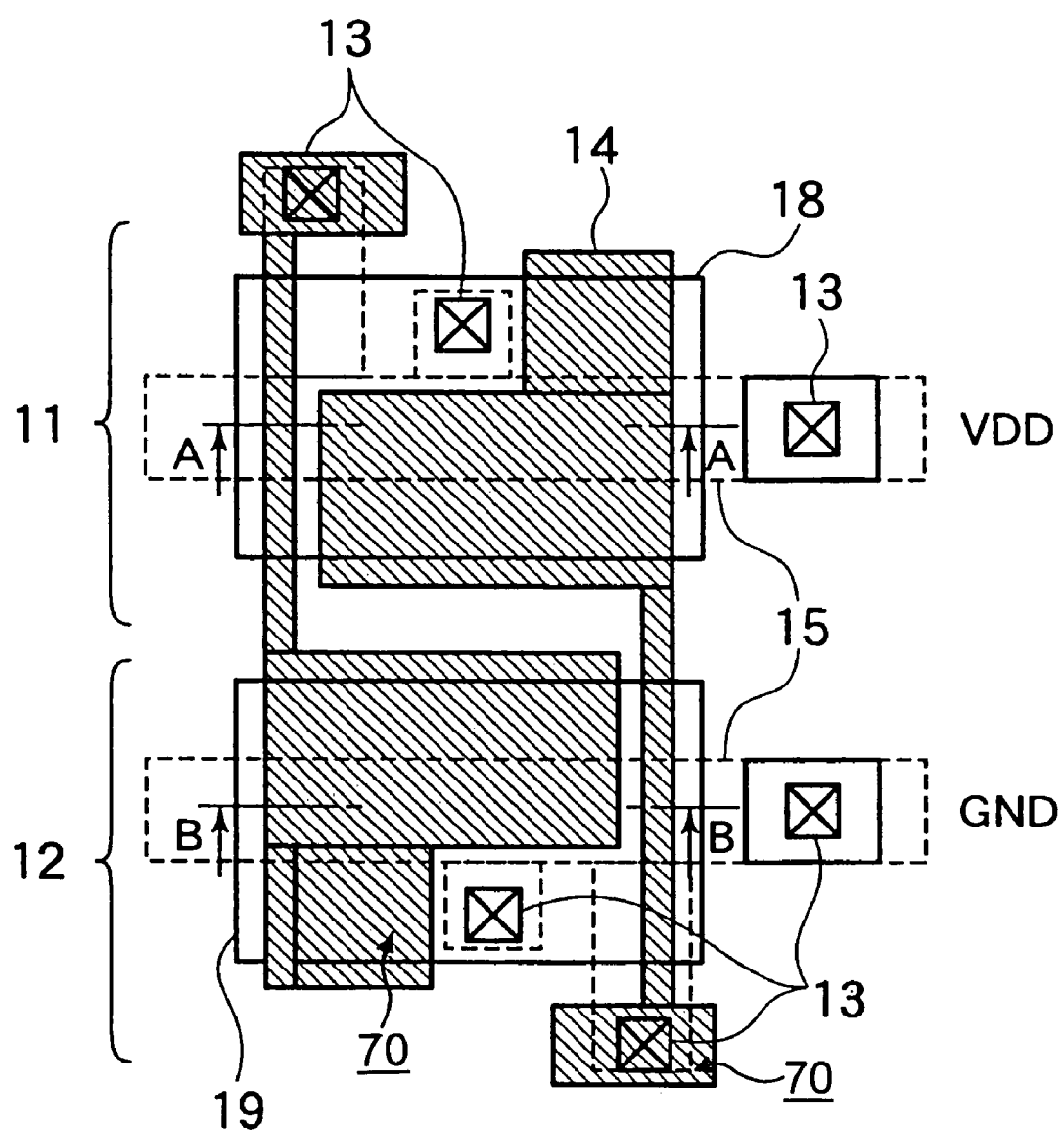
FIG. 1 is a schematic plan view of a capacity block of a gate array manufactured by a manufacturing method according to a first embodiment of the present invention.
Figure 2:
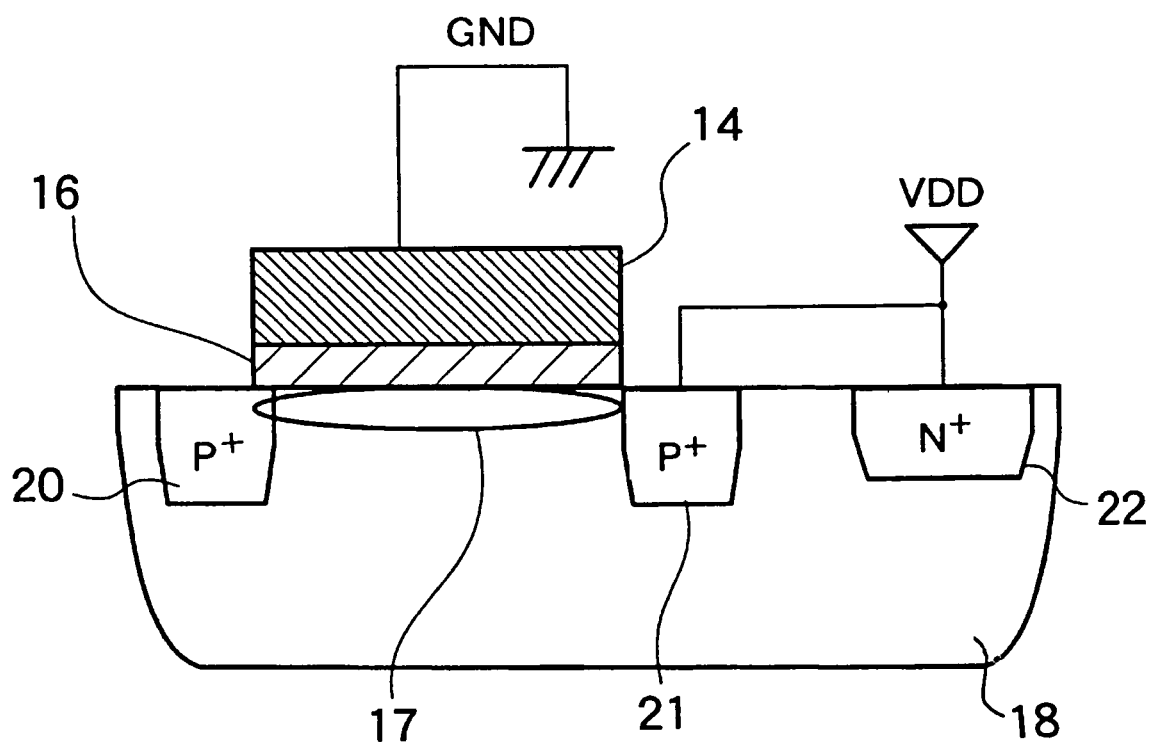
FIG. 2 is a schematic cross-sectional structural view of a PMOS in the capacity block of the gate array of FIG. 1.
Figure 3:
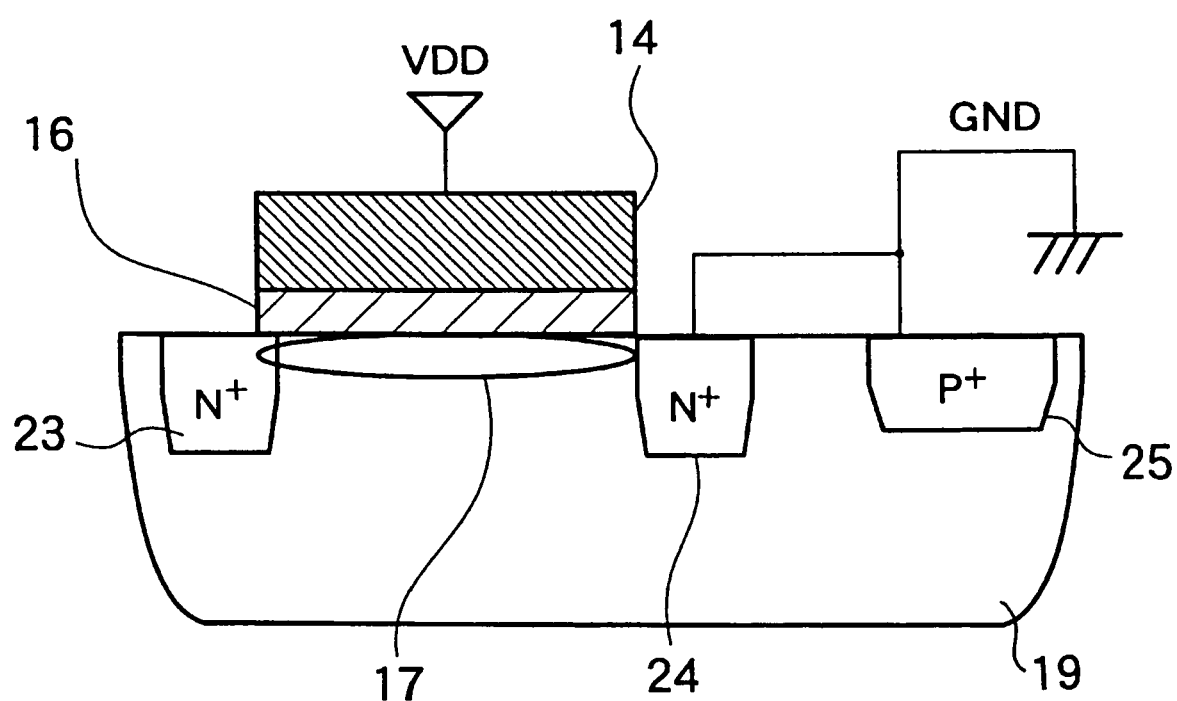
FIG. 3 is a schematic cross-sectional structural view of a NMOS in the capacity block of the gate array of FIG. 1.

A semiconductor device shown in FIG. 1 to FIG. 3 is a semiconductor device comprising a predetermined gate pattern and a capacitor, which is manufactured by forming a conductive film over a silicon insulator and by patterning the conductive film employing a customized reticle to form the predetermined gate pattern and the capacitor by a master slice technique.

In the method for manufacturing the semiconductor device of the present invention, a gate array may be manufactured as a semiconductor device.

In the method for manufacturing the semiconductor device of the present invention, any one reticle selected from multiple types of reticles that have been customized may be employed when the gate polysilicon layer is formed.

In the method for manufacturing the semiconductor device of the present invention, a capacitor may be formed in an unused basic cell among a plurality of basic cell included in the semiconductor device.

In the method for manufacturing the semiconductor device of the present invention, a process for providing an electrical coupling of the gate polysilicon layer to a power supply electric potential or a grounding electric potential may be further included.

In the method for manufacturing the semiconductor device of the present invention, the reticle employed in the case of forming the gate polysilicon layer may be suitably selected so that the size of the selected gate polysilicon layer provides the desired capacitive characteristics of the capacitor.

In the method for manufacturing the semiconductor device of the present invention, an Input/Output buffer may be formed as the capacitor.

In the method for manufacturing the semiconductor device of the present invention, the reticle employed in the case of forming the gate polysilicon layer may be suitably selected so that the gate length of the obtained gate polysilicon layer provides the desired delay characteristics of the capacitor.

In addition, since the method for manufacturing the semiconductor device utilizes the master slice method, an increase of the cost required for preparing the reticles can be prevented, as compared with the case of the embedded array or the cell base IC.

When the users include a type of user who request to have a capacity block (capacity cell) and another type of user who do not request any capacity block, the reticle from a dedicated customized gate reticle for offering a capacity cell and the other common gate reticles can be suitably selected on the occasion of forming the gate polysilicon layer so as to meet their needs. This allows the users to obtain the products at a substantially equivalent process cost even if any of the gate reticles is selected.

Here, the conventional master slice method is a method for manufacturing semiconductor devices that provides achieving the reduction of the development cost by commonly employing all reticles for any applications except the reticles for the metal layer, and thus is a manufacturing method for conducting the customization only on the occasion of forming the metal layer, and the method is typically employed in, for example, manufacturing of gate arrays.

On the contrary, the manufacturing method according to the present invention is different from the conventional manufacturing method by the conventional master slice technique, in view of conducting the customization even in the case of forming the gate polysilicon layer, in addition to conducting the customization on the occasion of formation of the metal layer.

First Embodiment

FIG. 1 is a schematic diagram, illustrating a capacity block (voltage source capacity block) that is a capacitor and a predetermined gate pattern of a gate array 100 manufactured by a method for manufacturing the gate array as a semiconductor device according to a first embodiment. The gate array 100 is manufactured by a master slice technique. FIG. 2 is a schematic diagram, illustrating a cross-sectional structure of a PMOS in the capacity block 70 shown in FIG. 1 (cross-sectional view along A-A line of FIG. 1). FIG. 3 is a schematic diagram, illustrating a cross-sectional structure of a NMOS in the capacity block 70 shown in FIG. 1 (cross-sectional view along B-B line of FIG. 1).

As shown in FIG. 1, a capacity block 70 of a gate array 100 comprises a PMOS 11 and a NMOS 12.

As shown in FIG. 2, PMOS 11 comprises: a N well 18; a first $P^+$ layer 20, a second $P^+$ layer 21 and a $N^+$ layer 22, all formed on an outer surface layer portion of the N well 18; and a gate polysilicon layer 14 formed through a gate oxide film 16 on the N well 18.

As shown in FIG. 1 and FIG. 2, the gate polysilicon layer 14 of the PMOS 11 is coupled to a grounding electric potential (GND) through contacts 13 and aluminum interconnect layers 15. Thus, the manufacturing method according to the present embodiment includes a process for coupling the gate polysilicon layer 14 to the grounding electric potential.

On the other hand, the second $P^+$ layer 21 and the $N^+$ layer 22 are coupled to a power supply electric potential (VDD) through the contacts 13 and the aluminum interconnect layers 15.

Although the contacts 13 and the aluminum interconnect layers 15 are not shown in FIG. 2, the contacts 13 are formed on the gate polysilicon layer 14, on the second $P^+$ layer 21 and on the N+ layer 22, respectively, and the aluminum interconnect layers 15 are formed on the contacts 13.

As shown in FIG. 3, the NMOS 12 comprises: a P well 19; a first $N^+$ layer 23, a second $N^+$ layer 24 and a $P^+$ layer 25, all formed on an outer surface layer portion of the P well 19; and a gate polysilicon layer 14 formed through a gate oxide film 16 on the P well 19.

As shown in FIG. 1 and FIG. 3, the gate polysilicon layer 14 of the NMOS 12 is coupled to the power supply electric potential (VDD) through the contacts 13 and the aluminum interconnect layers 15. Thus, the manufacturing method according to the present embodiment includes a process for coupling the gate polysilicon layer 14 to the power supply electric potential.

On the other hand, the second $N^+$ layer 24 and the $P^+$ layer 25 are coupled to the grounding electric potential (GND) through the contacts 13 and the aluminum interconnect layers 15.

Although the contacts 13 and the aluminum interconnect layers 15 are not shown in FIG. 3, the contacts 13 are formed on the gate polysilicon layer 14, on the second $N^+$ layer 24 and on the $P^+$ layer 25, respectively, and the aluminum interconnect layers 15 are formed on the contacts 13.

Here, inversion layers 17 are composed under the gate polysilicon layer 14 respectively in the N well 18 of the PMOS 11 and in the P well 19 of the NMOS 12. The inversion layer 17 is an electronic region having higher electron concentration, which is generated by the surface of the N well 18 and the P well 19 when the gate polysilicon layer 14 is applied with a voltage in the obtained gate array 100.

As such, the gate polysilicon layer 14 of the PMOS 11 is coupled to the grounding electric potential (GND), and the gate polysilicon layer 14 of NMOS 12 is coupled to the power supply electric potential (VDD) in the capacity block 70 illustrated in FIG. 1 to FIG. 3. Having such configuration, the capacitance is composed of the gate polysilicon layer 14, the gate oxide film 16 underlying thereof and the inversion layer 17.

Figure 15:
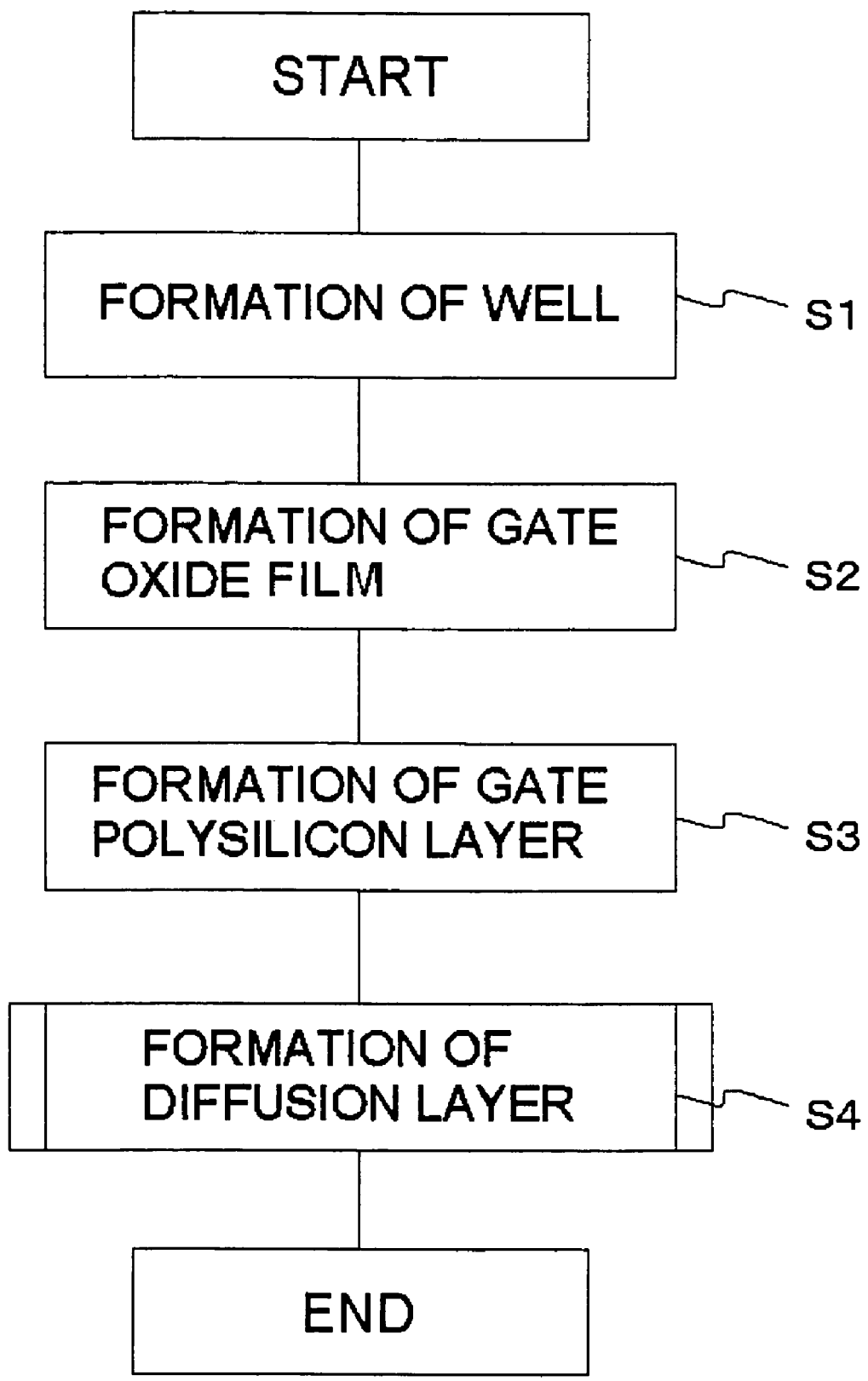
FIG. 15 is a flow chart, describing the method for manufacturing the gate array according to an embodiment.

As shown in the flow chart of FIG. 15, the capacity block 70 of the gate array 100 illustrated in FIG. 1 to FIG. 3 is formed by conducting, in sequence, the following process; formation of the well in a silicon insulator that is a semiconductor insulator by introducing an impurity having a conductivity type (S1); formation of a gate oxide film (S2); formation of the gate polysilicon layer (S3); formation of the diffusion layer by introducing an impurity having a conductivity type (S4). In this case, the N well 18 in the PMOS 11 is formed by introducing a N-type impurity therein, and the P well 19 in the NMOS 12 is formed by introducing a P⁻type impurity therein. The first $P^+$ layer 20 and the second $P^+$ layer 21 are formed by introducing a P⁻type impurity therein, and the first $N^+$ layer 23 and the second $N^+$ layer 24 are formed by introducing a N⁻ type impurity therein. In the gate array manufactured with a conventional master slice technique, these are formed by employing reticles for common use, which are also employed to manufacture the other types of semiconductor devices having similar structures. On the other hand, in the present invention, a customized reticle, which is different from the reticles for common use, is employed so as to form the gate polysilicon layer. As shown in the flow chart of FIG.

16, the gate polysilicon film is formed by conducting, in sequence, the following process; formation of the conductive film over a silicon insulator that is a semiconductor insulator (S41); formation of the resist onto the conductive film; patterning of the resist on the conductive film by employing the customized reticle (S42); and etching of the conductive film by employing the patterned resist (S43). In patterning the resist, the resist is patterned by employing the customized reticle, which is different from the reticles for common use. The customized reticle has a gate electrode pattern for the basic cell and a gate polysilicon layer pattern so as to form the capacitor block in the basic cell.

Here, the reticle may have a predetermined pattern, which includes a first gate pattern and a second gate pattern. The first gate pattern may have a predetermined pattern for forming the gate electrode of the basic cell. The second gate pattern may have a pattern for forming the capacitor element in the basic cell.

Figure 17:
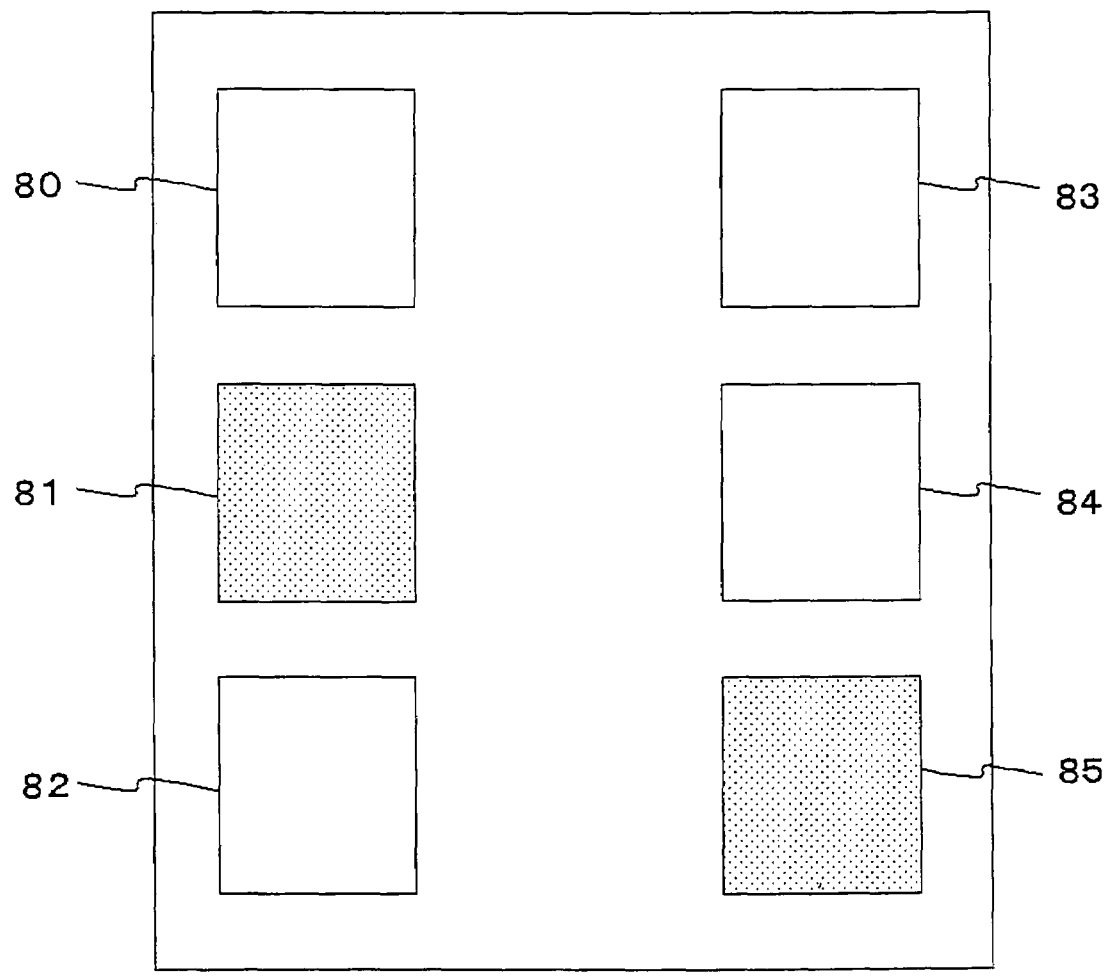
FIG. 17 is a schematic plan view showing the basic cell portions according to an embodiment.

An example of the specific method for manufacturing the capacity block 70 may be, for example, a method of disposing a capacity block 70 having an altered (extended) gate size (size of the gate polysilicon layer 14) on the basic cell portion 81 and on the basic cell portion 85 that is unused as transistor among a plurality of basic cell portions (a basic cell portion 80, a basic cell portion 81, a basic cell portion 82, a basic cell portion 83, a basic cell portion 84, and a basic cell portion 85) included in the gate array shown in FIG. 17, after the process of disposing a primitive block 90 is completed in LSI design.

Also, wirings may be performed to the basic cell portion 80, the basic cell portion 82, the basic cell portion 83, the basic cell portion 84 based on a circuit data.

Further, a capacitor element may be formed in the basic cell portion 81 and the basic cell portion 85 that are unused as transistor.

Figure 4:
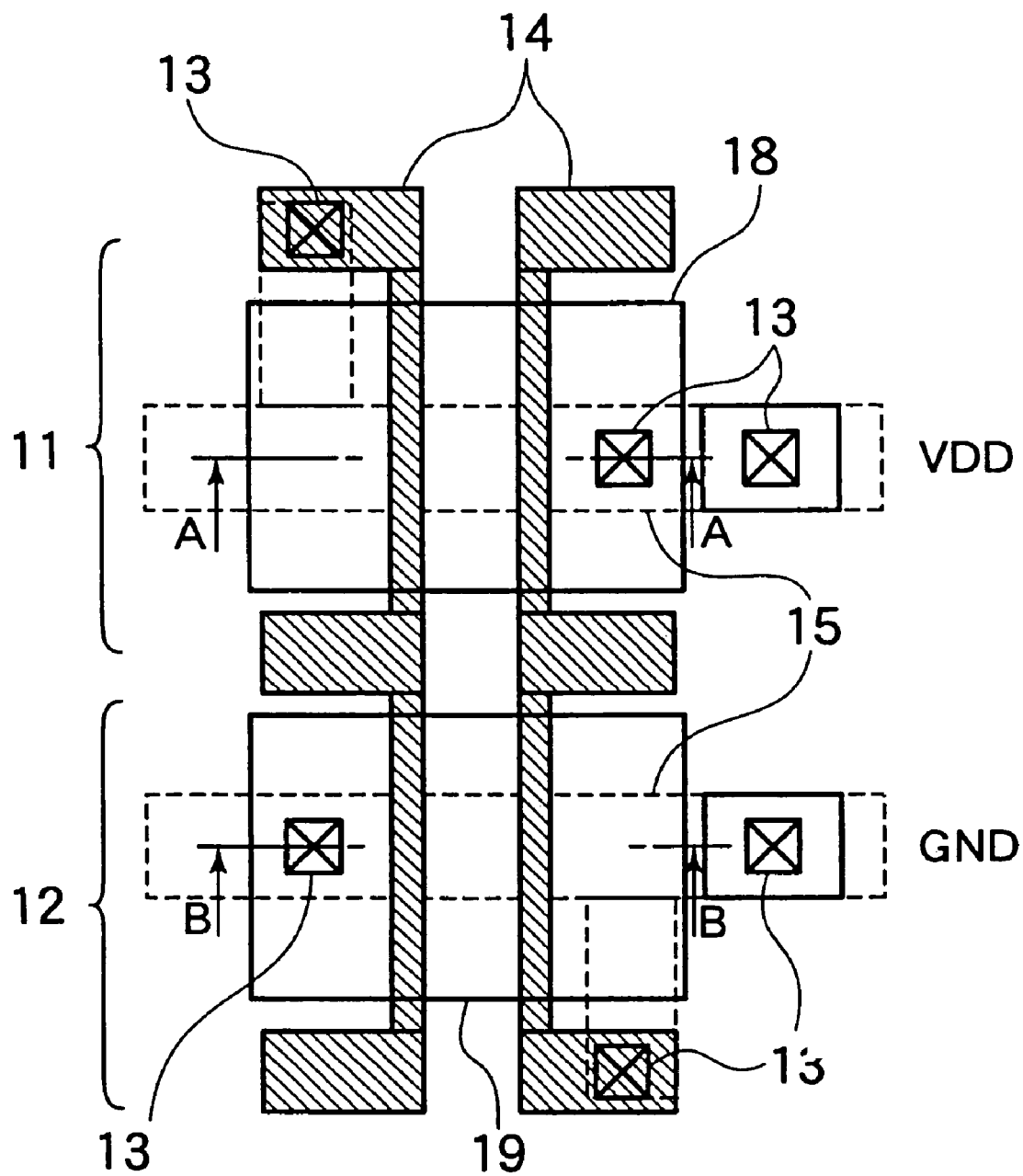
FIG. 4 is a schematic plan view of a gate array manufactured by a conventional master slice method.
Figure 5:
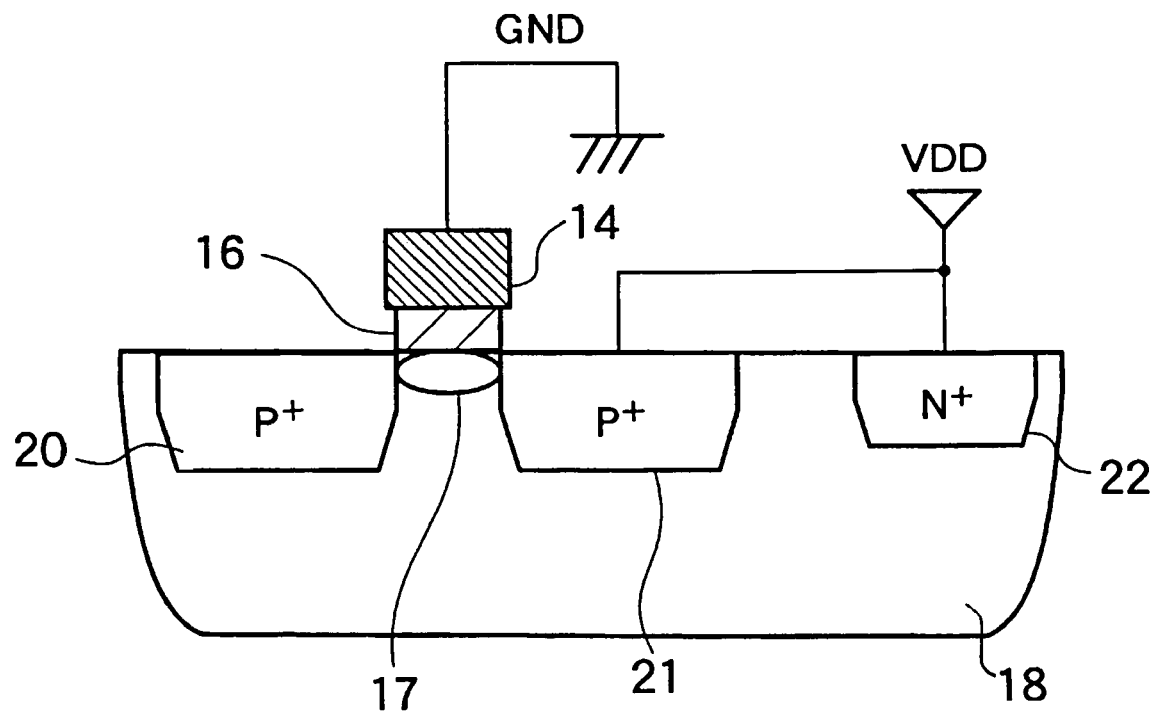
FIG. 5 is a schematic cross-sectional structural view of a PMOS in the capacity block of gate array of FIG. 4.
Figure 6:
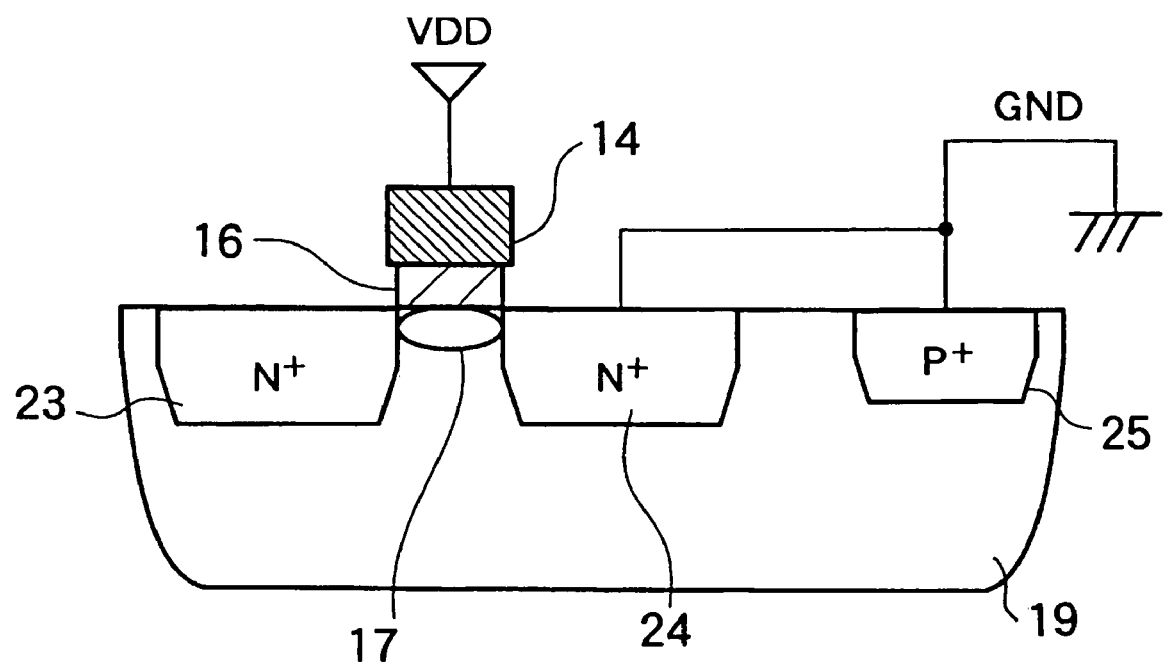
FIG. 6 is a schematic cross-sectional structural view of a NMOS in the capacity block of gate array of FIG. 4.
Figure 7:
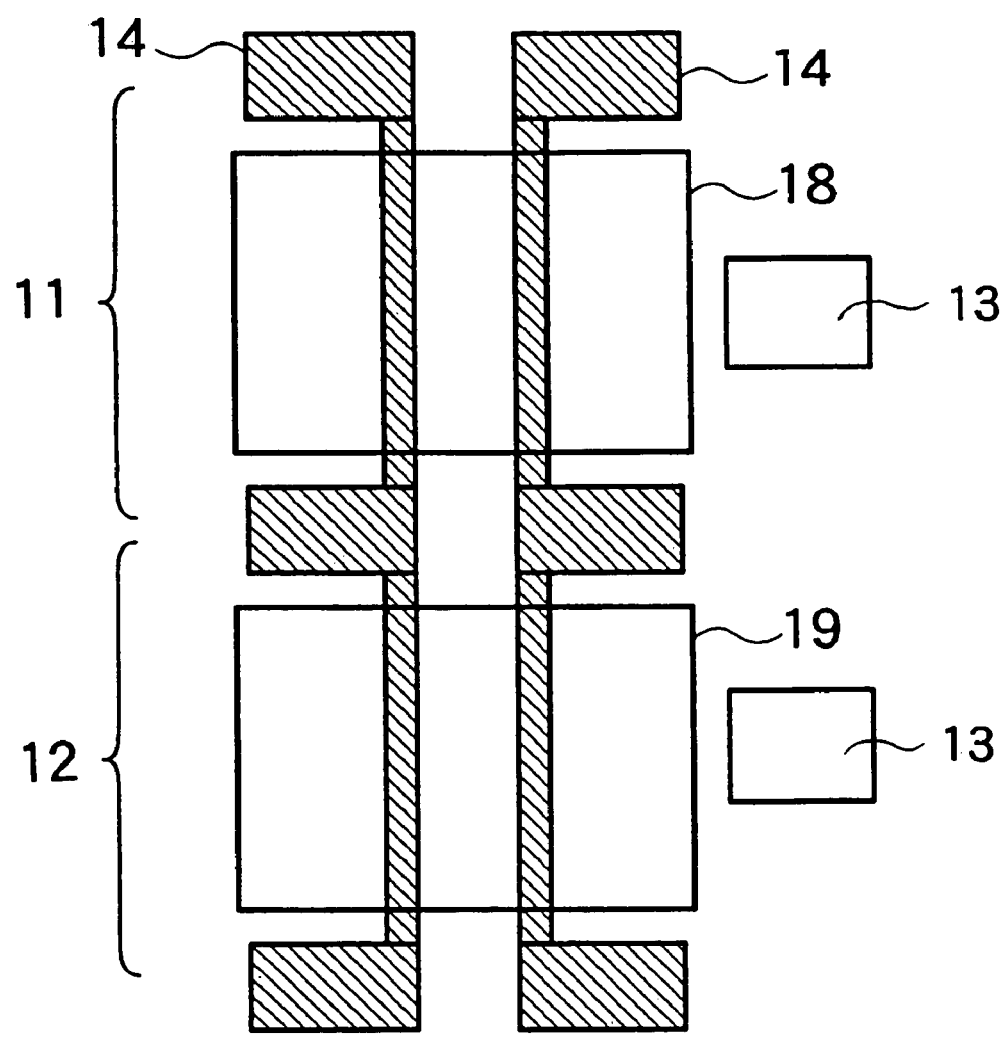
FIG. 7 is a schematic plan view of a structure of an internal base cell of the gate array, which will be the gate array of FIG. 4.

FIG. 4 is a schematic plan view, illustrating a capacity block of a gate array manufactured by a conventional master slice technique. FIG. 5 is a schematic cross-sectional view, illustrating a cross-sectional structure of a PMOS in the capacity block of FIG. 4 (cross-sectional view along A-A line of FIG. 4). FIG. 6 is a schematic cross-sectional view, illustrating a cross-sectional structure of a NMOS in the capacity block of FIG. 4 (cross-sectional view along B-B line of FIG. 4). FIG. 7 is a schematic plan view, illustrating a structure of an internal base cell of the gate array, which will provide the gate array of FIG. 4. In summary, the capacitance of the gate array illustrated in FIG. 4 to FIG. 6 is achieved by employing the internal base cell of the gate array shown in FIG. 7.

Here, in FIG. 4 to FIG. 7, identical numeral is assigned to an element commonly appeared in FIG. 1 to FIG. 3.

Here, the gate array shown in FIG. 4 to FIG. 6 is a gate array manufactured by a conventional master slice technique, in which all the portion except the metal layer is manufactured by employing a reticle that is also commonly employed for manufacturing other semiconductor devices having similar structure.

The advantageous effect obtainable by using the gate array according to the present embodiment will be described as follows.

In the gate array illustrated in FIG. 4 to FIG. 6, the size of the gate polysilicon layer 14 is set to be minimum, in order to utilize the maximum electrical characteristic of the transistor. Therefore, it is difficult to ensure the effective capacitance therein. On the contrary, the gate array 100 illustrated in FIG. 1 to FIG. 3 includes the gate polysilicon layer 14 in addition to the metal layer, both of which are manufactured by using the customized reticle that is different from the reticles employed for manufacturing the other semiconductor devices having similar structure. In other words, as can be seen from the comparison of the configuration shown in FIG. 1 to FIG. 3 with that in FIG. 4 to FIG. 6, the gate array 100 according to the first embodiment described above in reference to FIG. 1 to FIG. 3 includes the gate polysilicon layer 14 in the capacity block 70, the area of which is extended by the customization (for example, appropriately selected by the user). More specifically, the area of the gate polysilicon layer 14 in the capacity block 70 of the gate array 100 according to the first embodiment is extended in comparison with the area of the gate polysilicon layer manufactured by the conventional master slice method as described in reference to FIG. 4 to FIG. 6 by customizing the reticle employed on the occasion of formation of the gate polysilicon layer 14 (hereinafter referred to as gate reticle). In other words, the manufacturing method according to the present embodiment employs the customized reticle as the reticle for forming the gate polysilicon layer 14 of the gate array 100 in response to the request of the user. More specifically, for example, a reticle selected from the group consisting of multiple types of the reticles that have been customized in advance is employed on the occasion of the formation of the gate polysilicon layer 14. Having such process, the area of the inversion layer 17 can be increased in the gate array 100 according to the present embodiment as illustrated in FIG. 1 to FIG. 3. Therefore, the capacitance characteristics of the capacity block 70 can be considerably improved to effectively provide the countermeasure for the EMI. The reason for the above is that the variation of electric current flowing through the internal power supply interconnect in the LSI is reduced by electric current flowing in the charging and in the discharging of the capacitance that is composed of the gate polysilicon layer 14, the gate oxide film 16 underlying thereof and the inversion layer 17, thereby inhibiting the generation of the EMI noise.

As described above, in the present embodiment, the customization is also conducted in the formation of the gate polysilicon layer 14, in addition to conducting the customization on the occasion of formation of the metal layer, in method for manufacturing the semiconductor device (more specifically, e.g., gate array) by the master slice technique. Having such configuration, desired capacitance characteristics can be obtained, and thus the countermeasure for the EMI can preferably be achieved. In addition, the basic cell portion 81 and the basic cell portion 85 that are unused as a transistor can be effectively utilized (FIG. 17).

In addition, since the method for manufacturing the gate array 100 utilizes the master slice method, an increase of the cost required for preparing the reticles can be kept minimum, as compared with the case of the embedded array or the cell base IC.

In addition, even if the capacity cell (capacity block) is prepared in the conventional gate array, sufficient effect can not be obtained in countermeasure for the EMI noise, since the gate length of the basic cell is fixed in the conventional gate array. Moreover, when additional process steps are further provided, such as the case of removing the gate formed thereon and re-forming thereof again in order to form the capacity, as described in Japanese Patent Laid-Open No. 1994-77,442, a problem of increasing the process cost is occurred. Further, when the capacity of the trench structure employed in the DRAM process is adopted to the basic cell as described in Japanese Patent Laid-Open No. 1999-274,441, a problem of increasing the process cost is also occurred. On the contrary, the present embodiment includes customizing the gate polysilicon layer 14 by using the customized reticle. For example, the gate polysilicon layer 14 having a larger dimension such as gate length and the like is formed by using the dedicated gate reticle, only for an user who requests the countermeasure for the EMI noise. Having such process, a gate array having a larger-scale capacitance can be provided without increasing the process cost.

In addition, the dedicated customized gate reticle is used only for the user who requests the capacitance, and a reticle that is also commonly employed for manufacturing other semiconductor devices having similar structure may also be employed as in the conventional method for the user who does not request the capacitance. In other words, the reticle customized in accordance with a specification of the user can be employed. As a result, the correspondence in accordance with the needs of the user can be achieved.

Second Embodiment

Figure 8:
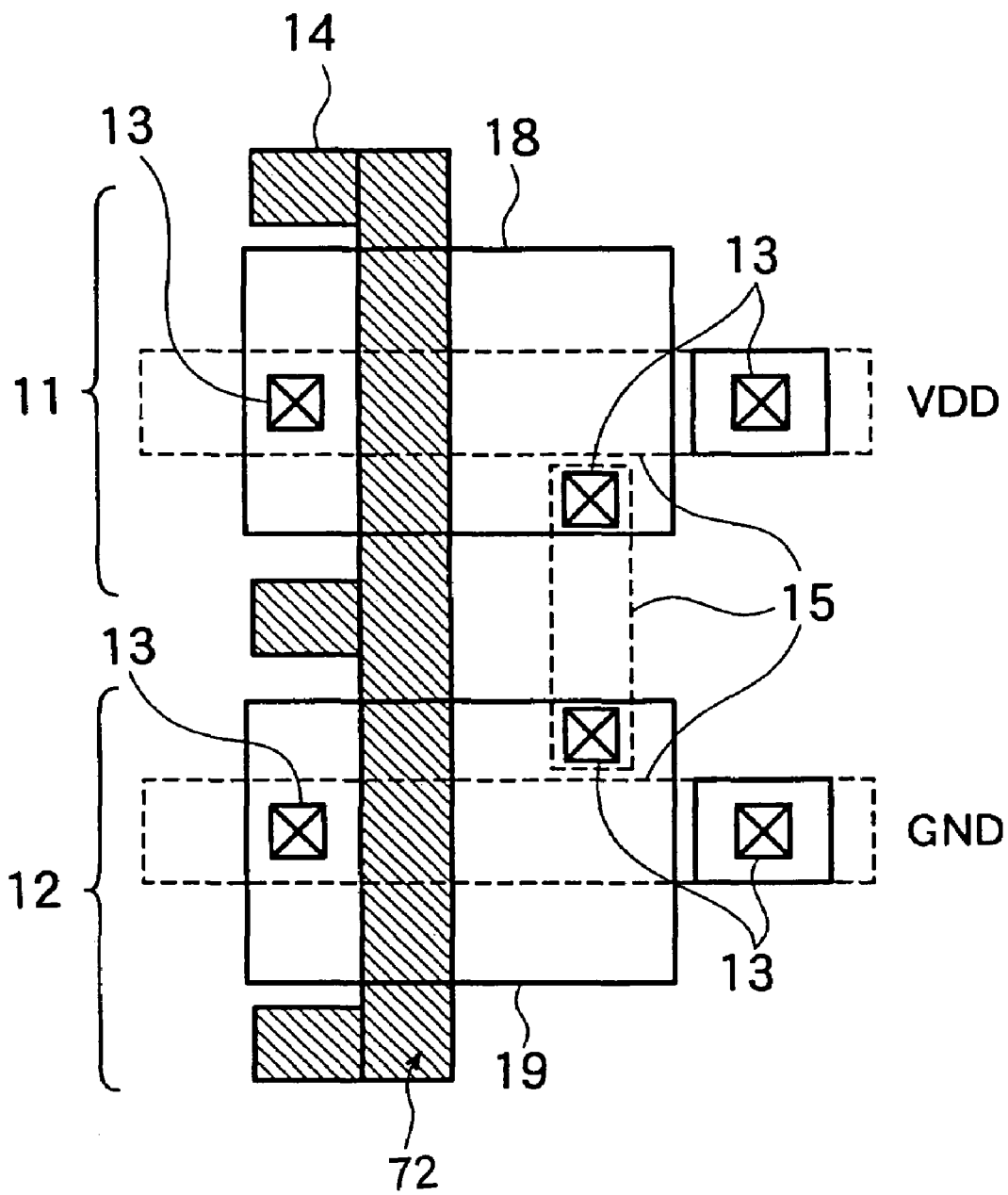
FIG. 8 is a schematic plan view of an exemplary embodiment of a block for adjusting delays of the gate array manufactured by the method for manufacturing the gate array according to the second embodiment of the present invention.
Figure 9:
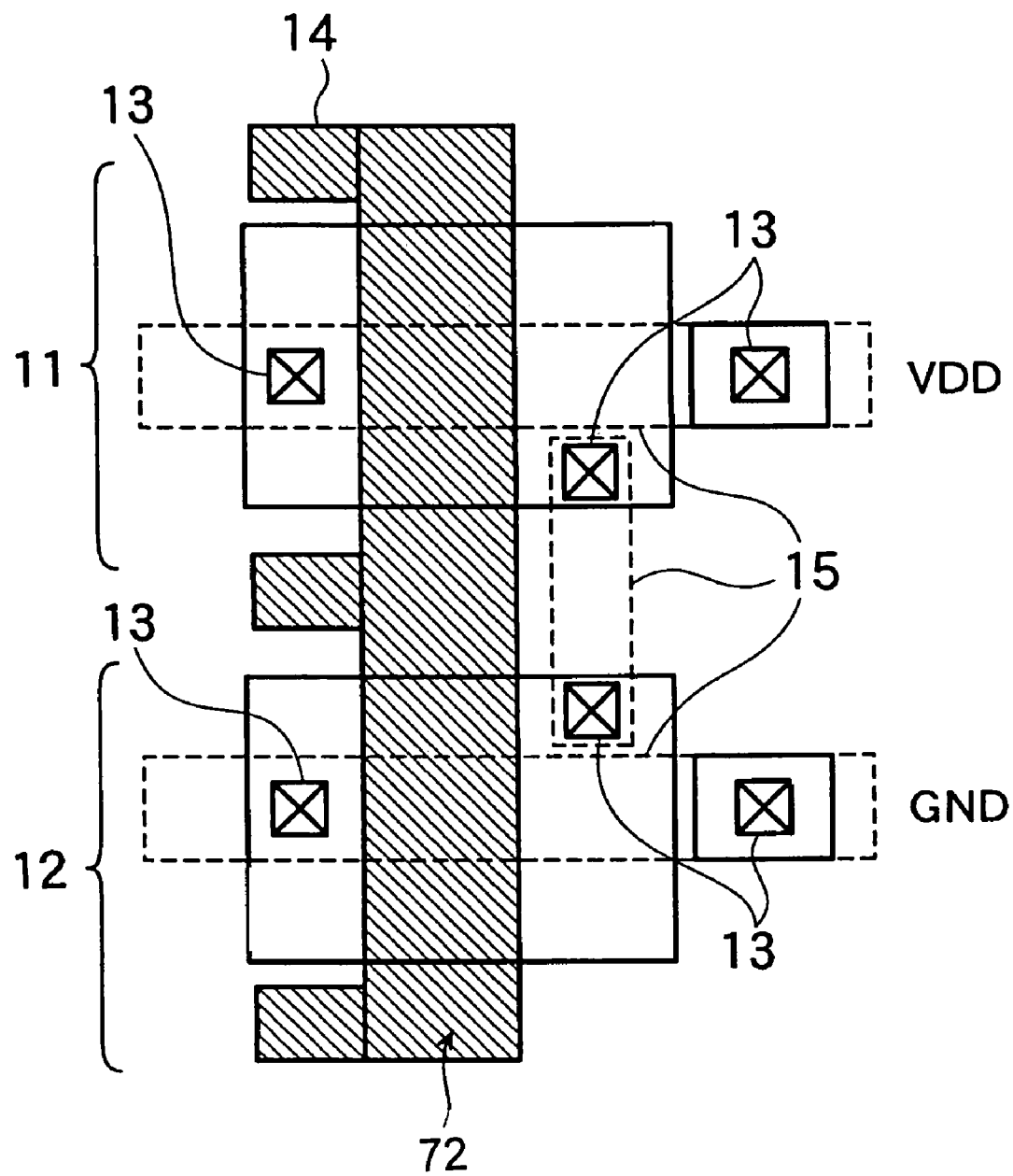
FIG. 9 is a schematic plan view of another exemplary embodiment of a block for adjusting delays of the gate array manufactured by the method for manufacturing the gate array according to the second embodiment of the present invention.
Figure 10:
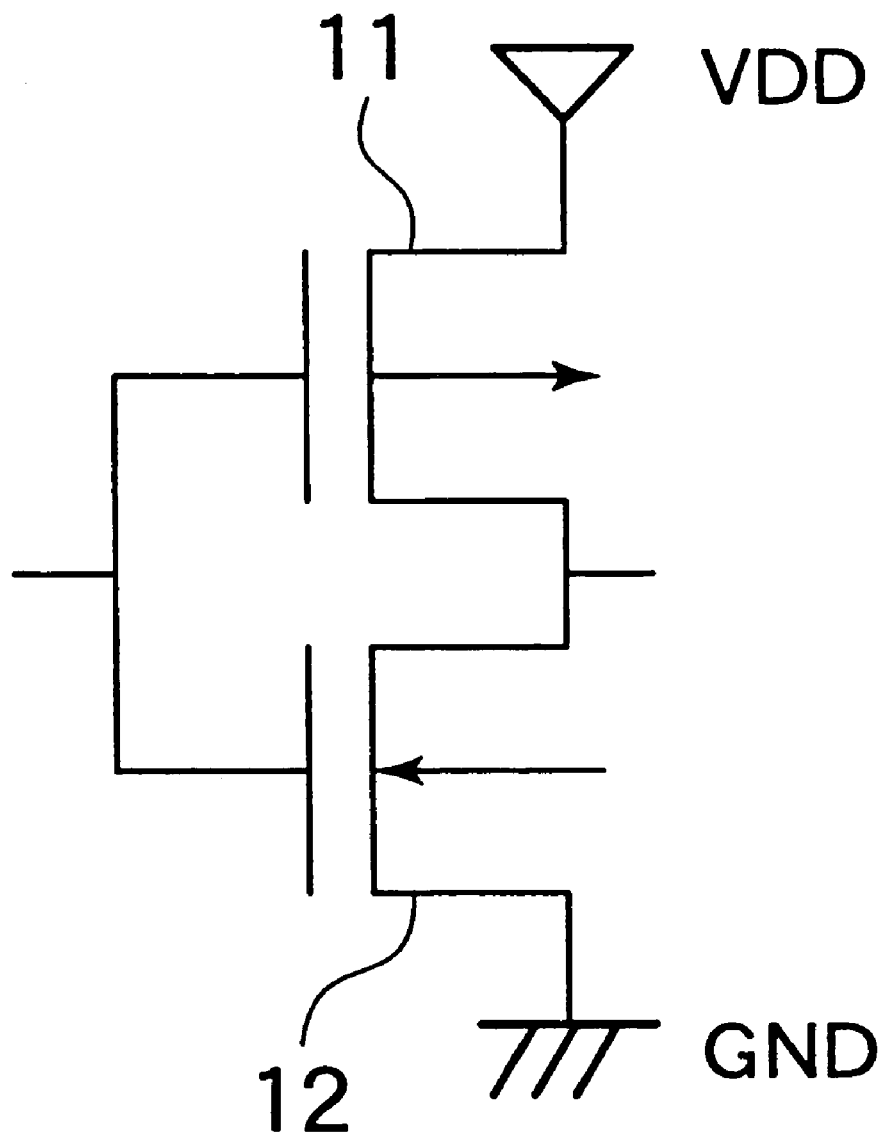
FIG. 10 is a schematic diagram of an equivalent circuit of the blocks for adjusting delays of the gate arrays of FIG. 8 and FIG. 9.

FIG. 8 is a schematic diagram, illustrating an example of a delay adjustment block 72 of the gate array 200 (capacity block as a delay block) manufactured by a method for manufacturing the gate array according to a second embodiment. FIG. 9 is a schematic diagram, illustrating another example of a delay adjustment block 72 of the gate array 200 manufactured by a method for manufacturing the gate array according to the second embodiment. FIG. 10 is a schematic diagram, illustrating an equivalent circuit of a delay adjustment block 72 of the gate array 200 manufactured by a method for manufacturing the gate array according to the second embodiment.

Figure 16:
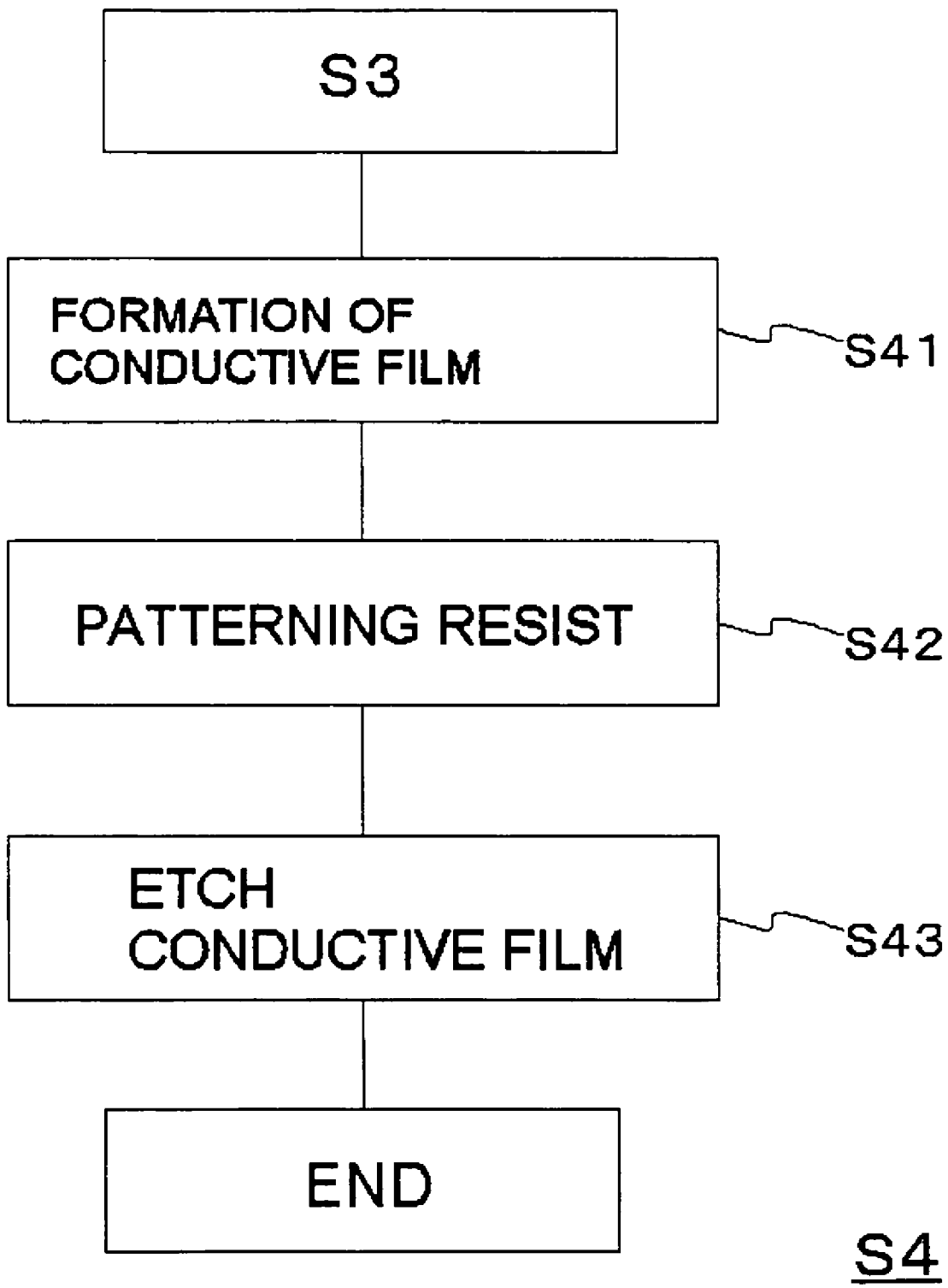
FIG. 16 is a flow chart, describing the method for manufacturing the gate array according to an embodiment.

The gate array 200 according to the present embodiment is manufactured by the process shown in the flow charts of FIG. 15 and FIG. 16, similarly as the gate array 100 described in the first embodiment.

As shown in FIG. 8 and FIG. 9, a delay adjustment block 72 of the gate array 200 comprises a PMOS 11 and a NMOS 12.

The second embodiment is different from the first embodiment in terms of employing the common gate polysilicon layer 14 for both the PMOS 11 and the NMOS 12. In other words, the gate of PMOS 11 and the gate of NMOS 12 are mutually coupled. Here, the gate polysilicon layer 14 is different from that of the first embodiment in terms of having no electric coupling to neither power supply electric potential (VDD) nor grounding electric potential (GND).

Further, source of the PMOS 11 (first P$^+$ layer formed in an outer surface layer portion of the N well 18: not shown in the drawings) is coupled through contacts 13 and aluminum interconnect layers 15 to the power supply electric potential (VDD). In addition, drain of the PMOS 11 (second P$^+$ layer formed in an outer surface layer portion of the N well 18: not shown in the drawings) is coupled through the contacts 13 and the aluminum interconnect layers 15 to source of the NMOS 12 (first N$^+$ layer formed in an outer surface layer portion of the P well 19: not shown in the drawings). Further, drain of the NMOS 12 (second N$^+$ layer formed in an outer surface layer portion of the P well 19: not shown in the drawings) is coupled through the contacts 13 and the aluminum interconnect layers 15 to the grounding electric potential (GND).

Therefore, the delay adjustment block 72 of the gate array 200 according to the present embodiment shown in FIG. 8 and FIG. 9 is an equivalent circuit shown in FIG. 10.

The gate array 200 shown in FIG. 8 and FIG. 9 is obtained by customizing the gate polysilicon layer 14 and providing larger size of the gate polysilicon layer 14 as compared with the structure shown in FIG. 7 to extend the gate length thereof.

The advantageous effect of the gate array 200 according to the present embodiment will be described as follows.

Figure 11:
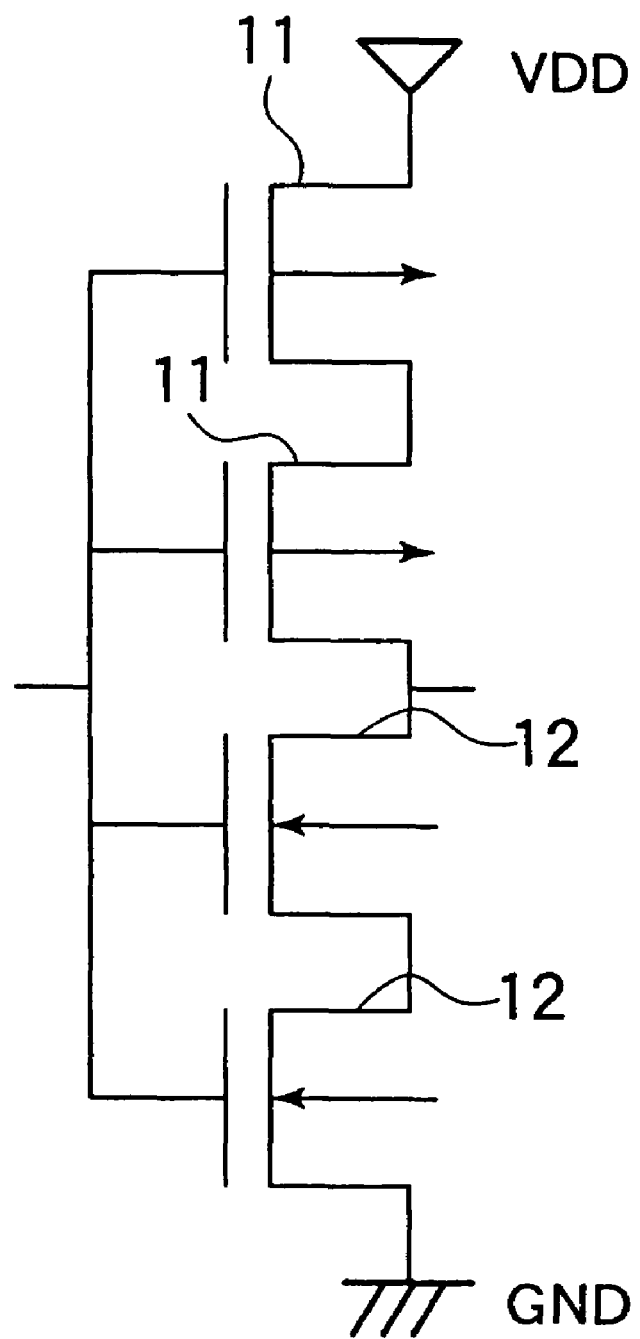
FIG. 11 is a schematic diagram of an equivalent circuit of the blocks for adjusting delay of the gate array manufactured by a conventional master slice method.

FIG. 11 shows an equivalent circuit of a delay adjustment block of the gate array in the case of employing the gate array of the structure shown in FIG. 7. Here, in the case of the gate array of the structure shown in FIG. 7, the gate length of the gate polysilicon layer 14 is fixed. Therefore, in order to ensure the required delay time in this case, the driving ability thereof should be reduced by vertically stacking the PMOS 11 and the NMOS 12 per multiple pieces thereof as shown in FIG. 11. However, when such configuration is selected, variation of the delay time by the process variation increases to possibly deteriorate the accuracy thereof. On the contrary, according to the gate array 200 shown in FIG. 8 and FIG. 9, the block such as inverter, the buffer and the like having lower driving ability while having larger gate capacitance can be manufactured. The delay block thus formed having larger gate capacitance and lower driving ability is very effective in adjusting the setup time and the hold time, and thus the reduction of the timing adjustment is anticipated as compared with the conventional delay adjustment method provided by the guidance of the interconnect or the relocation of the interconnect.

In the present embodiment, the customization is conducted even in the case of forming the gate polysilicon layer 14, in addition to conducting the customization in the case of forming the metal layer in the method for manufacturing the gate array 200 by the master slice technique. Having such process, desired gate length can be set for the gate polysilicon layer 14, and the delay adjustment block 72 can be prepared by reducing the driving ability of the delay block. In addition, since the configuration of vertically stacking the PMOS 11 and the NMOS 12 is not required, the delay adjustment block 72 having higher accuracy can be presented.

Since the gate length of the basic cell is fixed in the conventional gate array, sufficient effect for the delay adjustment is not obtained even if the capacity cell is to be prepared. Further, when additional process steps are further provided, such as the case of removing the gate formed thereon and re-forming thereof again in order to form the capacity, as described in Japanese Patent Laid-Open No. 1994-77,442, a problem of increasing the process cost is occurred. Further, when the capacity of the trench structure employed in the DRAM process is adopted to the basic cell as described in Japanese Patent Laid-Open No. 1999-274,441, a problem of increasing the process cost is also occurred. In addition, the aforementioned conventional technology is effective only for the power supply intensification of the chip internal region, and the capacity can not be applied for the delay adjustment. On the contrary, in the present embodiment, the gate polysilicon layer 14 is customized. For example, the gate polysilicon layer 14 can be formed by using the dedicated gate reticle, only for a user who requests the larger-scale capacitance for delay adjustment. Having such process, a larger-scale capacitance can be provided without increasing the process cost.

In addition, the dedicated customized gate reticle may be used only for the case of manufacturing of the gate array by the user who requests the larger-scale capacitance, and another reticle that is also commonly employed for manufacturing semiconductor devices having other similar structure thereof may also be employed as in the conventional method for the case of manufacturing of the gate array by the user who does not request the larger-scale capacitance. In other words, the reticle customized in accordance with specification of the user can be employed. Having such process, the correspondence in accordance with the needs of the user can be achieved.

Third Embodiment

Figure 12:
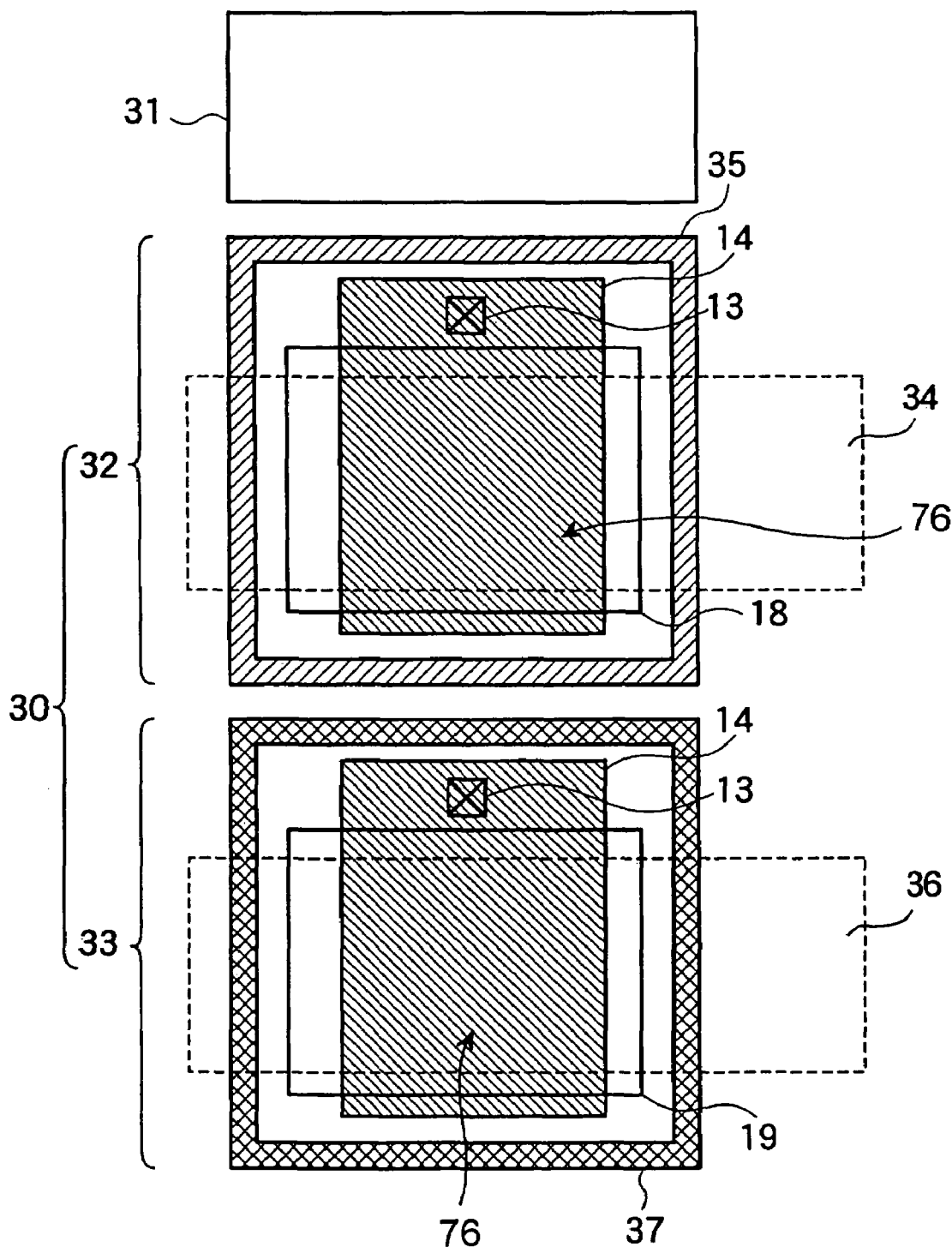
FIG. 12 is a schematic plan view of an I/O voltage source capacity block of a gate array manufactured by the method for manufacturing the gate array according to the third embodiment of the present invention.

FIG. 12 is a schematic plan view, illustrating a gate array 300 manufactured by a method for manufacturing a gate array according to the third embodiment.

The gate array according to the present embodiment is manufactured by the process showing in flow charts of FIG. 15 and FIG. 16, similarly as the gate array described in the first embodiment.

As shown in FIG. 12, the gate array 300 according to the third embodiment is different from that described in the first embodiment and the second embodiment, in terms of comprising a main buffer portion 30 and a pre-buffer portion 31. A capacity cell 76 included the main buffer portion 30 is used as an I/O buffer (Input/Output buffer) that temporarily has an output signal from the gate array 300 and/or an input signal to the gate array 300. Also, the capacitor cell 76 may be formed in the basic cell portion, therefore the basic cell may constitute the I/O buffer.

The main buffer portion 30 comprises a PMOS 32 and a NMOS 33.

The PMOS 32 comprises a gate polysilicon layer 14, a N well 18, an aluminum interconnect layer 34 for VDD coupled to a power supply electric potential (VDD), a contact 13 for electrically coupling the gate polysilicon layer 14 to a grounding electric potential (GND), and a sub power supply electric potential 35.

Similarly, the NMOS 33 comprises a gate polysilicon layer 14, a P well 19, an aluminum interconnect layer 36 for GND coupled to the grounding electric potential (GND), a contact 13 for electrically coupling the gate polysilicon layer 14 to the power supply electric potential (VDD), and a sub grounding electric potential 37.

Figure 13:
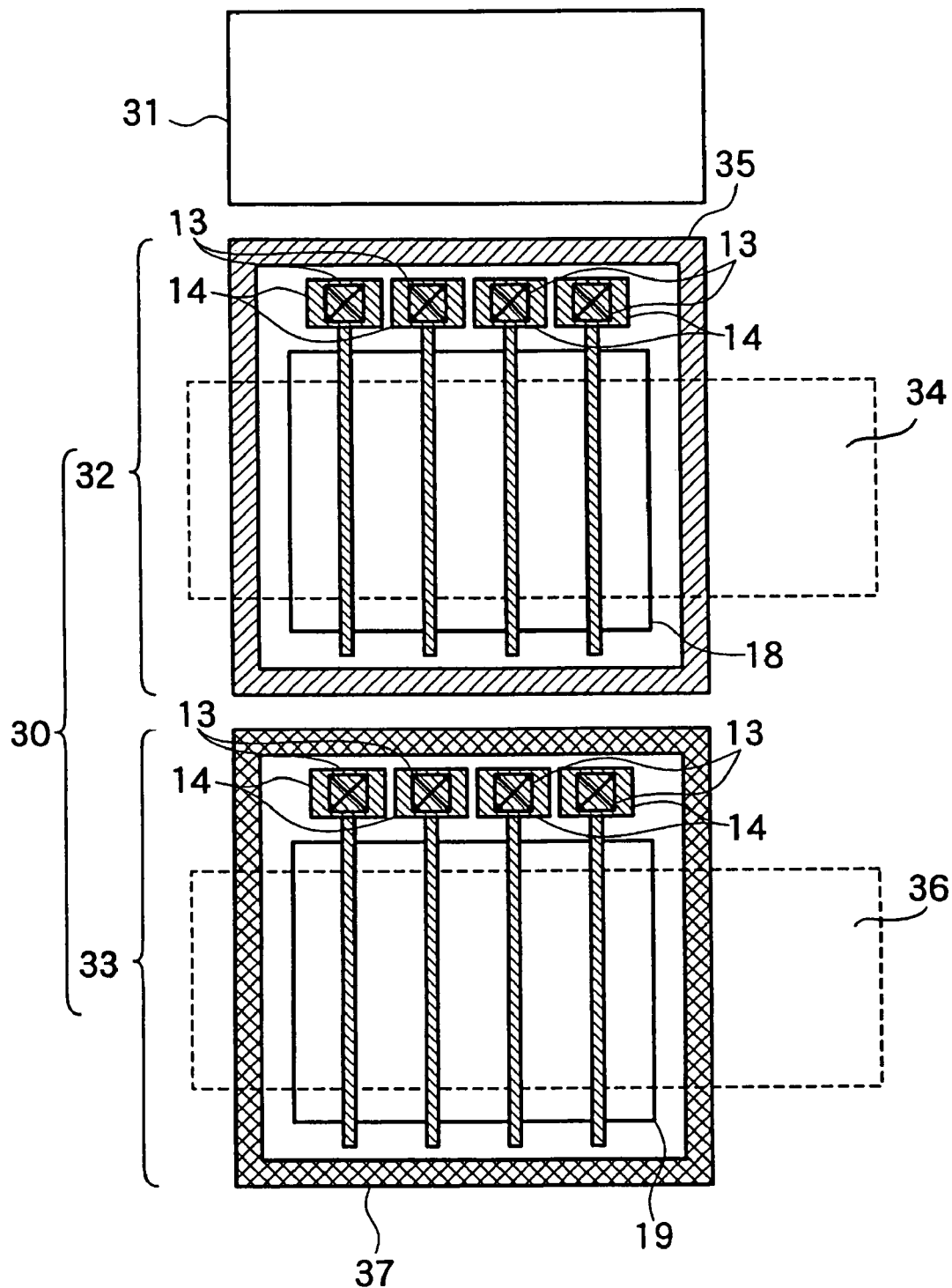
FIG. 13 is a schematic plan view of an I/O voltage source capacity block of a gate array manufactured by a conventional master slice method.
Figure 14:
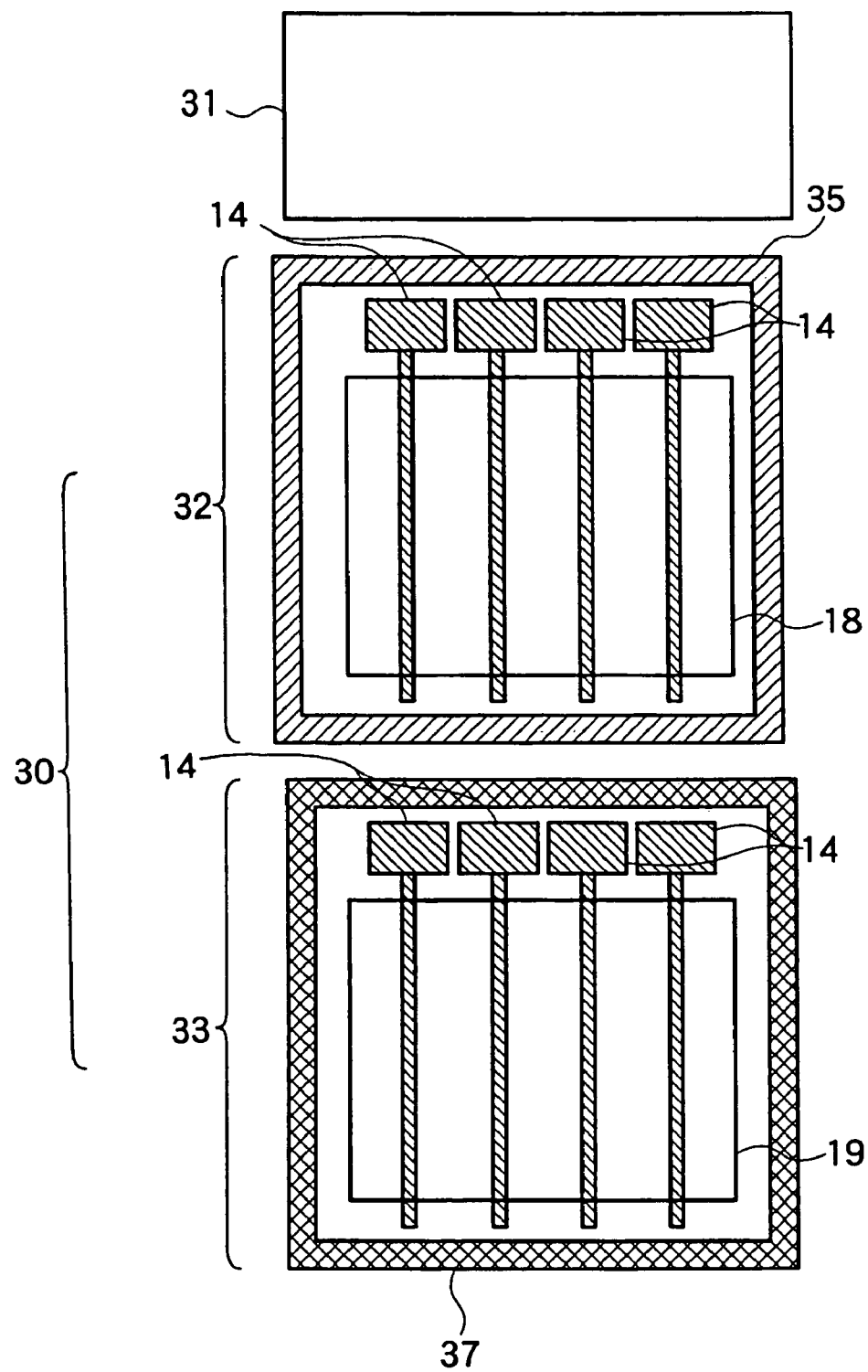
FIG. 14 is a schematic plan view of an I/O slot of the gate array, which will be the gate array of FIG. 13.

FIG. 13 is a schematic plan view, illustrating a gate array manufactured by a conventional manufacturing method. FIG. 14 is a schematic plan view, illustrating a structure of an I/O slot of the gate array for forming the gate array of FIG. 13. In FIG. 13 and FIG. 14, identical numeral is assigned to an element commonly appeared in FIG. 12.

Here, the gate array shown in FIG. 14 is a gate array manufactured by a conventional master slice method, in which all the portion except the metal layer is manufactured by employing a reticle that is also commonly employed for manufacturing other semiconductor devices having similar structure.

The advantageous effect of the gate array according to the present embodiment will be described as follows.

The gate array shown in FIG. 13 includes the capacity cell, which is composed of using the I/O slot of the gate array of FIG. 14, and it is difficult to ensure sufficient capacitance with such type of the capacity cell. On the contrary, the gate array 300 according to the present embodiment (FIG. 12) is manufactured by customizing the gate polysilicon layer 14 using the customized gate reticle to form the capacity cell 76 that is used as an I/O buffer, similarly as in the first embodiment.

In addition, as shown in FIG. 12, large-scale capacitance can be achieved in the case of the gate array according to the present embodiment, as compared with the gate array shown in FIG. 13. In addition, the electric current variation of the power supply line of the I/O buffer is inhibited by charging and discharging to the power supply interconnect by the formed capacitance, thereby providing considerably effective simultaneous operation countermeasures for both of the EMI noise and the I/O buffer.

In the conventional gate array, the gate length of the basic cell is fixed. Therefore, sufficient effect can not be obtained in the simultaneous operation countermeasures for the EMI noise and the I/O buffer even if the capacity cell is prepared. Further, when additional process steps are further included, such as the case of removing the gate formed thereon and re-forming thereof again in order to form the capacity, as described in Japanese Patent Laid-Open No. 1994-77,442, a problem of increasing the process cost is occurred. Further, when the capacity of the trench structure employed in the DRAM process is adopted to the basic cell as described in Japanese Patent Laid-Open No. 1999-274,441, a problem of increasing the process cost is also occurred. In addition, the aforementioned conventional technology is effective only for the intensification of the power supply within the internal region of the chip, and thus the capacity can not be applied to the simultaneous operation countermeasure for the I/O buffer. On the contrary, the present embodiment employs the configuration of forming the gate polysilicon layer 14 by conducting the customization by using the customized reticle. More specifically, for example, gate polysilicon layer 14 may be formed by using the dedicated gate reticle, only for an user who requests simultaneous operation countermeasure for the EMI noise and the I/O buffer. Having such process, a larger-scale capacitance can be provided without increasing the process cost.

In addition, the dedicated customized gate reticle may be used only for the case of manufacturing of the gate array by the user who requests the larger-scale capacitance, and a reticle that is also commonly employed for manufacturing semiconductor devices having other similar structure thereof may also be employed as in the conventional method for the case of manufacturing of the gate array by the user who does not request the larger-scale capacitance. In other words, the reticle customized in accordance with specification of the user may be employed. Having such process, the correspondence in accordance with the needs of the user can be achieved.

While the present invention has been described in reference to the embodiments, it is apparent to those skilled in the art that the disclosures contained herein are for the purpose of illustrating the present invention only, and other various configurations of the structures or processes may be suitably employed without departing from the scopes and spirits of the invention.

For example, while the above embodiments describes the conformation of manufacturing the gate array, the customized reticle may also be employed for the configuration of manufacturing other types of semiconductor devices such as structural application specific integrated circuit (ASIC) and the like.

Further, while the above embodiments describe the conformation of employing the gate polysilicon layer as the gate electrode film, other type of conductive film may be employed.

Further, while the above embodiments describes the conformation, in which a reticle selected from the group consisting of multiple types of the reticles that have been customized in advance is employed on the occasion of the formation of the gate polysilicon layer 14, the gate polysilicon layer 14 may also be formed by using the customized reticle.

Further, while the above embodiments describes the conformation, in which a capacity block having an extended gate size is disposed in the basic cell portions that is unused as a transistor among a plurality of basic cell portions included in the gate array, the capacity block may also be disposed in other portion.

It is apparent that the present invention is not limited to the above embodiment that may be modified and changed without departing from the scope and spirit of the invention.

What is claimed is:

1. A method for manufacturing a semiconductor device, comprising manufacturing the semiconductor device by forming a wiring based on circuit data of a basic cell including a transistor formed by employing a reticle having a predetermined pattern, comprising;

forming a conductive film over a semiconductor insulator; and patterning said conductive film by employing a reticle having a predetermined first gate pattern for forming a gate electrode of said basic cell and a second gate pattern for forming a capacitor element in said basic cell.

2. The method according to claim 1, wherein said second gate pattern is provided so as to form said capacitor element in said basic cell, which is not used as a transistor.

3. The method according to claim 1, wherein said basic cell is a component, which comprises of an I/O buffer.

* * * * *